US008890537B2

(12) United States Patent
Valcore, Jr. et al.

(10) Patent No.: US 8,890,537 B2
(45) Date of Patent: *Nov. 18, 2014

(54) HARMONIC DERIVED ARC DETECTOR (75) Inventors: John Valcore, Jr., Rochester, NY (US);
Yufeng Han, Rochester, NY (US);
Jonathan Smyka, Rochester, NY (US);
Salvatore Polizzo, Henrietta, NY (US);
Aaron T. Radomski, Wyoming, NY (US)

(73) Assignee: MKS Instruments, Inc., Andover, MA (US)

( * ) Notice: Subject to any disclaimer, the term of this patent is extended or adjusted under 35 U.S.C. 154(b) by 796 days.

This patent is subject to a terminal disclaimer.

(21) Appl. No.: 12/764,145

(22) Filed: Apr. 21, 2010

(65) Prior Publication Data

US 2010/0201371 A1 Aug. 12, 2010

Related U.S. Application Data (63) Continuation of application No. 11/675,974, filed on Feb. 16, 2007, now Pat. No. 7,728,602.

(51) Int. Cl.
*H01J 37/00* (2006.01)
*H05H 1/00* (2006.01)
*H01J 37/32* (2006.01)

(52) U.S. Cl.
CPC ........ *H05H 1/0062* (2013.01); *H01J 37/32944* (2013.01); *H01J 37/32082* (2013.01); *H01J 37/32935* (2013.01); *H01J 2237/0206* (2013.01)
USPC ........................................................ 324/536

(58) Field of Classification Search
CPC ..................... H01J 37/32082; H01J 37/32944
USPC .......................................................... 324/536
See application file for complete search history.

(56) References Cited

U.S. PATENT DOCUMENTS

| 5,025,135 A | 6/1991 | Gesche et al. |
| 5,103,182 A | 4/1992 | Moslehi |
| 6,332,961 B1 | 12/2001 | Johnson et al. |

(Continued)

FOREIGN PATENT DOCUMENTS

| CN | 1270640 A | 10/2000 |
| JP | 2001516940 A | 10/2001 |

(Continued)

OTHER PUBLICATIONS

El-Hag, a. H., "A New Technique to Detect Dry-Band Arcing," IEEE Trans. on Power Delivery, vol. 20, Apr. 2005, pp. 1202-1203.

(Continued)

*Primary Examiner* — Jeff Natalini
(74) *Attorney, Agent, or Firm* — Harness, Dickey & Pierce, P.L.C.

(57) ABSTRACT

An arc detection system includes a radio frequency (RF) signal probe that senses a RF signal at an input of a RF plasma chamber and that generates a signal based on at least one of the voltage, current, and power of the RF signal. A signal analyzer receives the signal, monitors the signal for frequency components that have a frequency greater than or equal to a fundamental frequency of the RF signal, and generates an output signal based on the frequency components. The output signal indicates that an arc is occurring in the RF plasma chamber.

45 Claims, 9 Drawing Sheets

(56) References Cited

U.S. PATENT DOCUMENTS

| | | | |
|---|---|---|---|
| 6,351,683 | B1* | 2/2002 | Johnson et al. ............ 324/623 |
| 6,535,785 | B2 | 3/2003 | Johnson et al. |
| 6,608,446 | B1 | 8/2003 | Coumou |
| 6,708,123 | B2 | 3/2004 | Gerrish |
| 6,736,944 | B2 | 5/2004 | Buda |
| 6,902,646 | B2 | 6/2005 | Mahoney et al. |
| 7,015,414 | B2* | 3/2006 | Mitrovic ............ 219/121.43 |
| 7,292,045 | B2 | 11/2007 | Anwar et al. |
| 7,334,477 | B1 | 2/2008 | Pirkle |
| 7,413,672 | B1 | 8/2008 | Keil |
| 2005/0016683 | A1 | 1/2005 | Kim et al. |
| 2005/0067386 | A1* | 3/2005 | Mitrovic ............ 219/121.43 |
| 2005/0183821 | A1 | 8/2005 | Parsons |
| 2005/0212450 | A1 | 9/2005 | Martinez et al. |
| 2006/0241879 | A1 | 10/2006 | van Zyl |

FOREIGN PATENT DOCUMENTS

| | | |
|---|---|---|
| JP | 2001516963 A | 10/2001 |
| JP | 2005268214 A | 9/2005 |
| WO | 9914394 A1 | 3/1999 |
| WO | 9914699 A1 | 3/1999 |

OTHER PUBLICATIONS

El-Hag, A. H. et al., "Use of Low Frequency Harmonic Components as a Signature to Detect Arcing on HTV Silicone Rubber in Salt-Fog," Conf. Record of the 2002 IEEE Int'l. Symposium on Electrical Insulation, Apr. 2002, pp. 212-215.

Keenan, J. et al., "Arc Detectors," 20th Int'l Telecomm. Energy Conf. (INTELEC), Oct. 1998, pp. 710-715.

Leprettre, B. et al., "Detection of Electrical Series Arcs using Time-Frequency Analysis and Mathematical Morphology," 6th Int'l. Symposium on Signal Processing and its Applications, Aug. 2001, pp. 446-449.

Parker, J. et al., "Monitoring and Preventing Arc-Induced Wafer Damage in 300mm Manufacturing," 2004 IEEE Int'l Conf. on Integrated Circuit Design and Technology, 2004, pp. 131-134.

Rogers, J. H. et al., "RF Arc Detection using Harmonic Signals," Fusion Engineering, 16th IEEE/NPSS symposium, vol. 1, 30 Sep.-5 Oct. 1995, pp. 522-525.

Scime, E. et al., "Laser induced fluorescence in a pulsed argon plasma," Rev. Sci. Instrum., vol. 76, 2005, pp. 026107-1 to -3.

Sidhu, T. S. et al., "On-line Detection and Location of Low-Level Arcing in Dry-Type Transformers," IEEE Trans. on Power Delivery, vol. 16, No. 1, Jan. 2002, pp. 135-141.

Yin, Y. et al., "Micro-arcing in radio frequency plasmas," J. of Physics D: Appl. Phys., vol. 37, Issue 20, 2004, (pp. 2871-2875) Abstract Only.

Koh, A.T.-C.; Thronhill, N.F.; Law, V.J.; "Principal component analysis of plasma harmonics in end-point detection of photoresist stripping" Electronics Letters vol. 35, Issue 16, Aug. 5, 1999, pp. 1383-1385; see whole document.

Masayasu Hino, Takashi Aono, Masato Nakajima, and Shinichi Yuta, "Light emission computed tomography system for plasma diagnostics" Applied Optics, vol. 26, Issue 22, Nov. 15, 1987 pp. 4742-4746 see the abstract, figure 2-6.

International Search Report for International Patent Application No. PCT/US2007/022647 dated Feb. 25, 2008.

Korean Notice of Preliminary Rejection for Application No. 10-2009-7016818 dated Jul. 8, 2013 and the English translation thereof.

Japanese Notification of Reasons for Refusal for Japanese Patent Application No. 2009-549568, dated Nov. 27, 2012, and English translation thereof.

Chinese Office Action for Chinese Application No. 200780050086.7 dated Oct. 20, 2011.

Korean Notice of Preliminary Rejection for Korean Patent Application No. 10-2009-7016818, dated Dec. 20, 2012, and English translation thereof.

* cited by examiner

FIG. 9

HARMONIC DERIVED ARC DETECTOR

CROSS-REFERENCES TO RELATED APPLICATIONS

This application is a continuation of U.S patent application Ser. No. 11/675,974 filed on Feb. 16, 2007, issued as U.S. Pat. No. 7,728,602 on Jun. 1, 2010. The specification of the above application is incorporated herein by reference in its entirety.

FIELD

The present disclosure relates to arc detection in radio-frequency plasma processing systems.

BACKGROUND

The statements in this section merely provide background information related to the present disclosure and may not constitute prior art.

RF plasma has been extensively used for semiconductor manufacturing in recent decades. Field data shows that arcing is a main cause of wafer defects and damage. Real-time arc detection is critical to maintain and improve the yield in IC manufacturing.

Arcing is a sudden release of energy between parts in a plasma chamber, which accompanies fast electromagnetic transients typically in the range of 1 to 100 microseconds. Arc detection equipment generally includes two parts: a Langmuir probe for picking up signals and a real-time signal-processing unit. Based on the probe coupling, the detection can be classified as invasive and non-invasive techniques.

Figure 1:
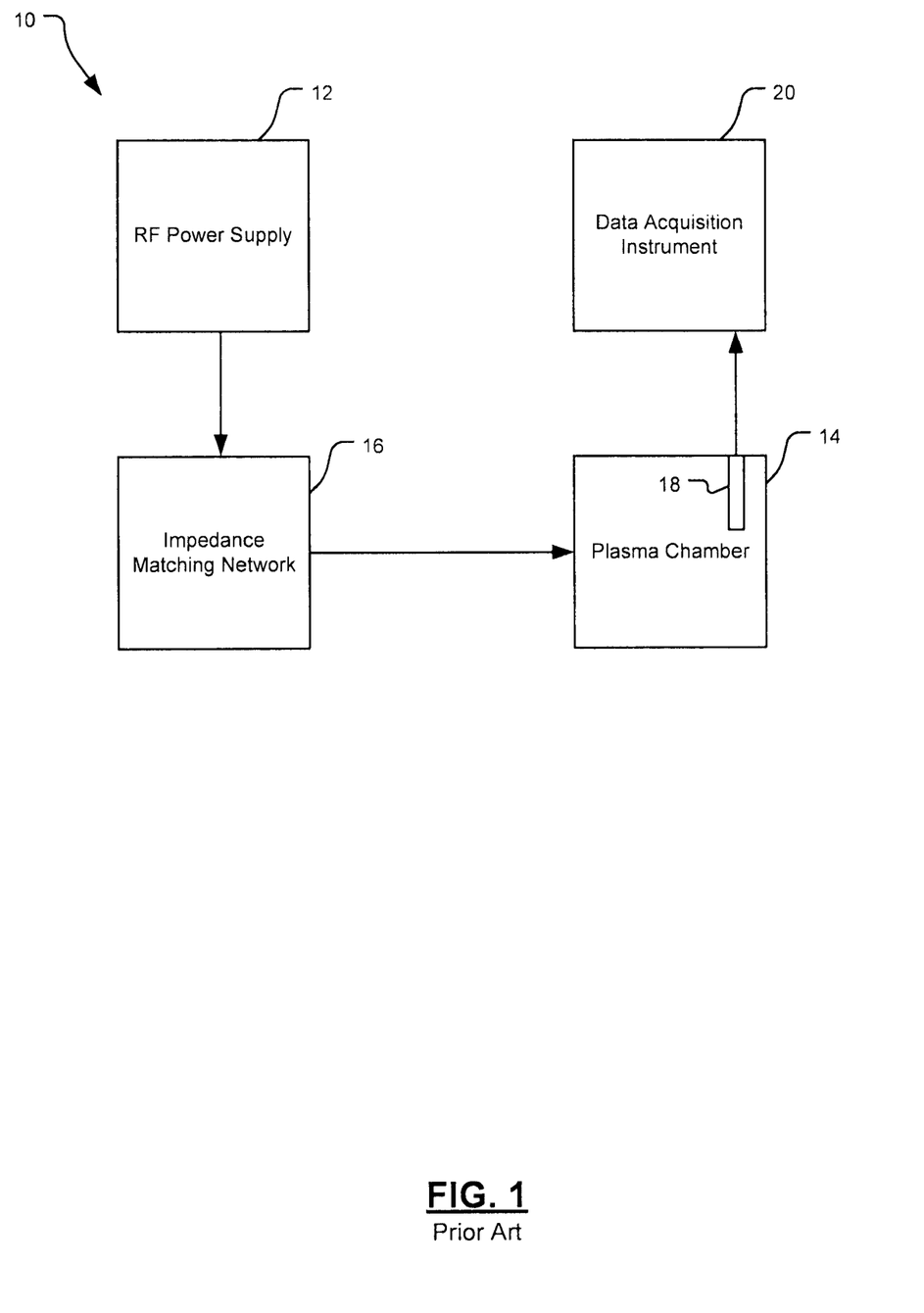
FIG. 1 is a functional block diagram of a RF plasma delivery system in accordance with the prior art.

Referring now to FIG. 1, one of several configurations is shown of a radio frequency (RF) plasma delivery system 10. RF plasma delivery system 10 includes a RF generator 12 that provides power to a plasma chamber 14. An impedance matching network 16 can be inserted in a feed line between the output of RF generator 12 and the input of plasma chamber 14. A Langmuir probe 18 can be inserted into plasma chamber 14. Langmuir probe 18 generates a signal based on the plasma in plasma chamber 14. A data acquisition instrument 20 receives and processes the signal to characterize the plasma.

Langmuir probe 18 is a typical probe for plasma diagnostics and is well developed for determination of plasma characteristics including densities, temperatures, and energies. Langmuir probe 18 is essentially an antenna that is inserted into the plasma sheath to obtain plasma information. Because Langmuir probe 18 is inserted inside the plasma chamber 14, Langmuir probe 18 is invasive to the chamber processes. While this method of assessing the plasma behavior is accurate and informative, the intrusiveness of Langmuir probe 18 inhibits its use in a production environment.

Non-invasive arc detection can be based on broadband radiation that occurs during the arcing. Techniques using optical detection and florescence spectroscopy are based on this principle. These methods generally need a variety of sensors and are thus more expensive than Langmuir probe 18.

SUMMARY

An arc detection system includes a radio frequency (RF) signal probe that senses a RF signal at an input of a RF plasma chamber and that generates a signal based on at least one of the voltage, current, and power of the RF signal. A signal analyzer receives the signal, monitors the signal for frequency components that have a higher frequency than a fundamental frequency of the RF signal, and generates an output signal based on the frequency components. The output signal indicates that an arc is occurring in the RF plasma chamber.

An arc detection system includes a radio frequency (RF) signal probe that senses a RF signal at an input of a RF plasma chamber and that generates a signal based on at least one of the voltage, current, and power of the RF signal. An analog to digital converter converts the signal to a digital signal. A signal analyzer receives the digital signal, monitors the digital signal for frequency components of the RF signal that have a higher frequency than a fundamental frequency of the RF signal, and generates an output signal based on the frequency components. The output signal indicates that an arc is occurring in the RF plasma chamber.

A method of detecting an arc in a RF plasma processing system includes sensing a RF signal at an input of a RF plasma chamber, generating a signal based on at least one of the voltage, current, and power of the RF signal, monitoring the signal for frequency components that have a higher frequency than a fundamental frequency of the RF signal, and generating an output signal based on the frequency components. The output signal indicates that an arc is occurring in the RF plasma chamber.

A method of detecting an arc in a RF plasma processing system includes sensing a RF signal at an input of a RF plasma chamber, generating a signal based on at least one of the voltage, current, and power of the RF signal, converting the signal to a digital signal, monitoring the digital signal for frequency components of the RF signal that have a higher frequency than a fundamental frequency of the RF signal, and generating an output signal based on the frequency components. The output signal indicates that an arc is occurring in the RF plasma chamber.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 2:
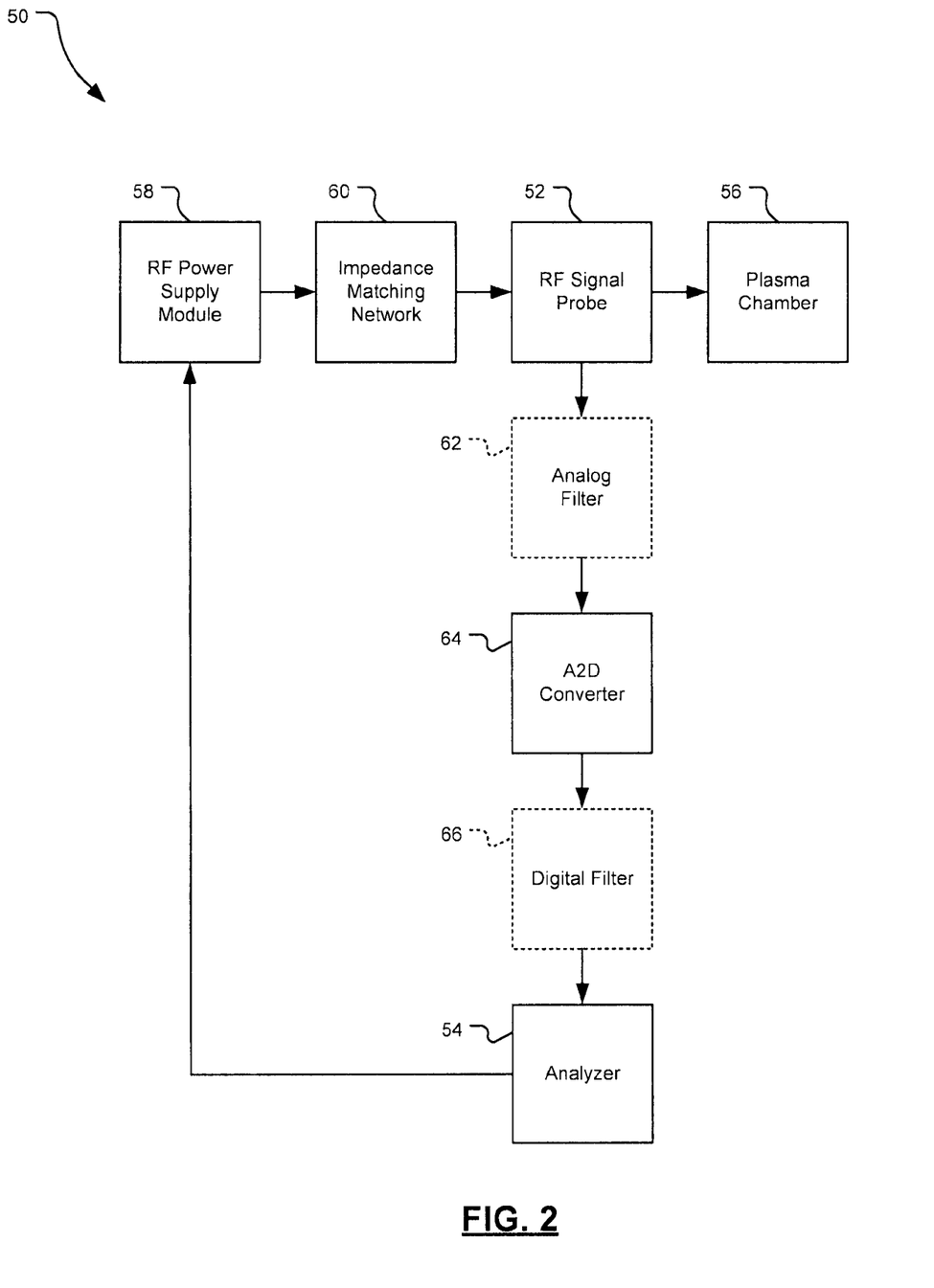
FIG. 2 is a functional block diagram of a RF plasma delivery system that includes a RF analyzer.

Referring now to FIG. 2, one of several embodiments is shown of a RF plasma processing system 50. Plasma processing system 50 includes a RF signal probe 52 and an associated RF analyzer 54 that detects arcs within a plasma chamber 56. A RF power supply 58 provides power for plasma chamber 56. In some embodiments an impedance matching network 60 can be inserted in a feed line between the output of RF power supply 58 and the input of plasma chamber 56.

RF signal probe 52 couples into the feed line at the input of plasma chamber 56. RF signal probe 52 generates one or more signals based on the RF voltage and/or current in the feed line. The signals are communicated to an analog-to-digital converter (A2D) 64 that digitizes the signals. In some embodiments an analog filter 62 can filter the signals before they are communicated to A2D 64. The digitized signals are communicated to RF analyzer 54. In some embodiments a digital filter 66 can filter the digitized signals before they are communicated to RF analyzer 54.

RF analyzer 54 performs a spectral analysis of the digitized signal to determine whether certain harmonics are present within the RF signal and to determine relationships of the harmonics to the fundamental frequency of the RF power, and to determine the relationships of the harmonics to one another. RF analyzer 54 determines whether there is an arc in plasma chamber 56 based on the analysis of the harmonics.

In some embodiments RF power supply 58 can be a MKS ENI Products Spectrum 1.5 KW 13.56 MHz RF generator, impedance matching network 60 can be a MKS ENI Products MWH-100 Matchwork, RF signal probe 52 can be a MKS ENI Products VIP2000 Broadband probe head and/or plasma chamber 62 can be an AMAT capacitively-coupled bell jar chamber.

Figure 3:
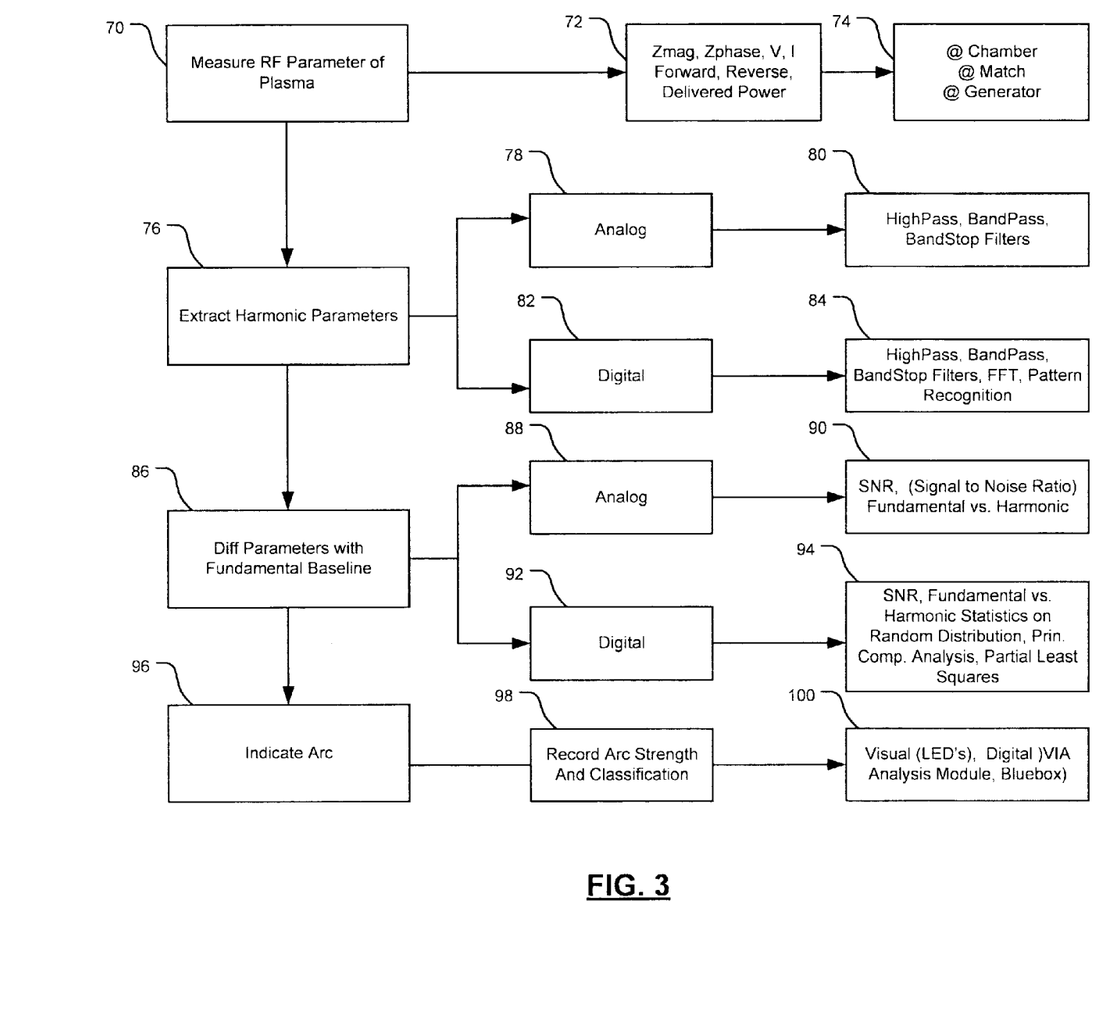
FIG. 3 is a process flow diagram that is employed by the RF analyzer.

Referring now to FIG. 3, one of several embodiments is shown of processes that can be employed by RF analyzer 54 to detect arcs in plasma chamber 56. The processes begin at block 70 by receiving the signals from RF signal probe 52. The signals are based on the RF power at the input to plasma chamber 56. At block 72 the processes determine the impedance (Z) magnitude, impedance phase, voltage, current, forward power, and reflected power. As indicated by block 74, the processes can also directly or indirectly quantify the aforementioned characteristics for the RF power at the output of the RF power supply 58 and at impedance matching network 60.

At block 76 the processes extract harmonic information from the signals. Blocks 78 and 80 indicate that the harmonic information can be extracted by applying analog high pass, band pass, and/or band stop filters to the signals. Blocks 82 and 84 indicate that the harmonic information can also be extracted by applying digital high pass, band pass, band stop filters, performing FFTs, and/or performing pattern recognition on the digitized signals from block 70. It should be sufficient for arc detection to extract the harmonic information for the first nine harmonics of the fundamental frequency, however more or fewer harmonics may be used to achieve a desired degree of sensitivity for detecting arcs.

At block 86 the processes compare parameters during plasma processing with the same parameters that were taken for a baseline plasma process. Blocks 88 and 90 indicate the compared parameters can include analog signal-to-noise ratio (SNR) and fundamental vs. harmonic frequencies. Blocks 92 and 94 indicate that the compared parameters such as SNR, fundamental vs. harmonic statistics on random distribution, principal component analysis, and partial least squares analysis can also be performed in the digital domain.

At block 96 the processes determine whether an arc is occurring based on the measurements and comparisons of blocks 70 though 94. Methods for making the determinations are provided below. In block 98 the processes record and/or classify the arc. In block 100 the processes generate an output signal that can be employed to notify a user and/or other equipment, such as RF power supply 58 and/or impedance matching network 60, that an arc is occurring.

Referring now to FIGS. 4A-9, several plots of parameters are shown. The plots depict experimental results with various embodiments of RF plasma processing system 50. The experiments characterize plasma while atmospheric gas was supplied to plasma chamber 56 at a constant flow of 30 sccm while maintaining a constant pressure of 250 mTorr. The impedance of impedance matching network 60 was fixed after plasma was successfully ignited to eliminate any effects the variable capacitors of impedance matching network 60 had on the plasma. The RF power was at a fundamental frequency of 13.56 MHz and the power level was varied to produce instabilities within the plasma resulting in the formation of arcs. The signals from RF signal probe 52 were captured by a digital oscilloscope at a sampling rate of 2 Gs/s.

Figure 4A:
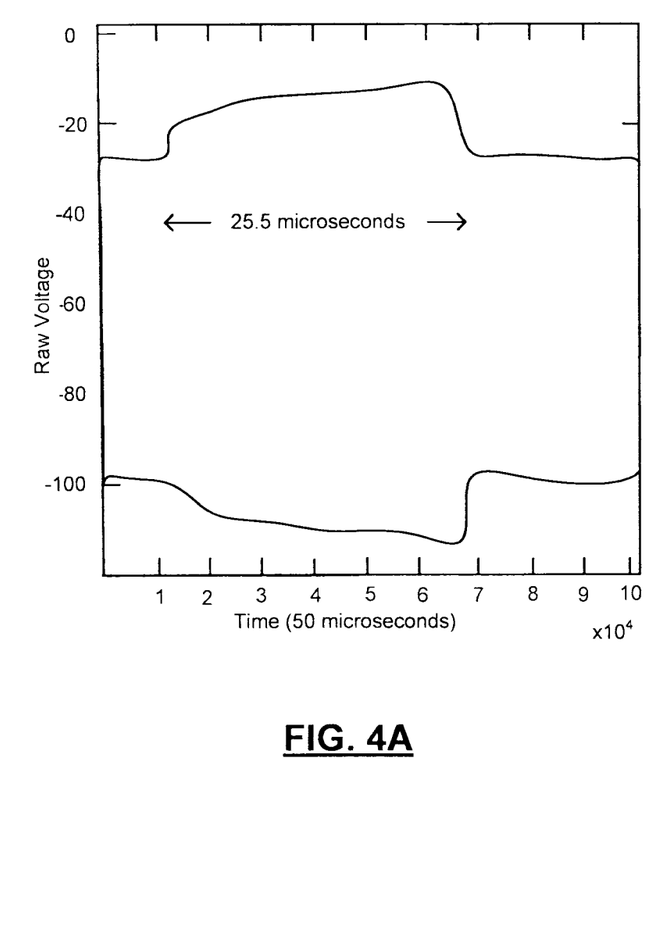
FIGS. 4A and 4B are plots of RF voltage during a plasma arc.
Figure 4B:
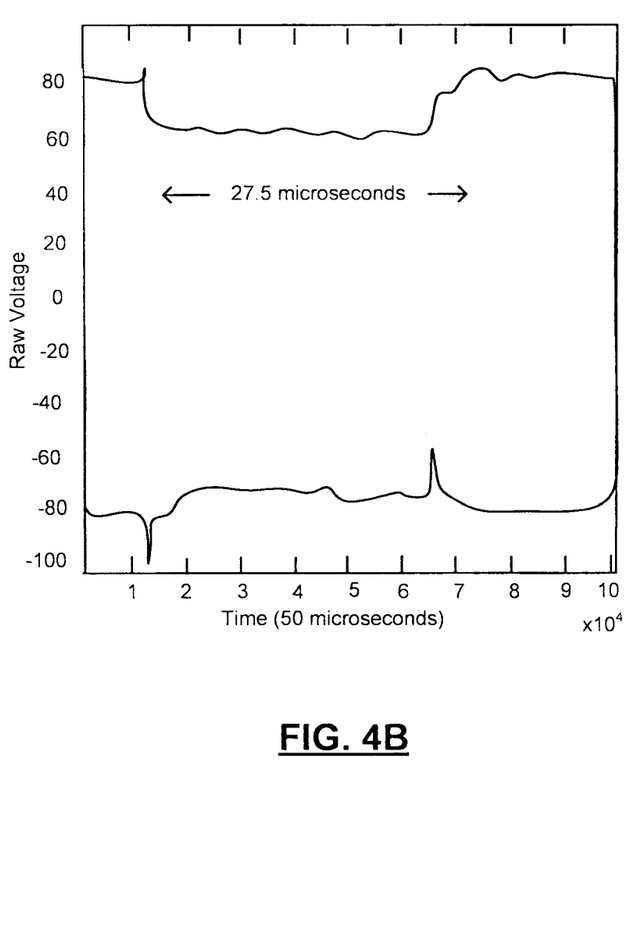

Referring now to FIG. 4A, a Langmuir probe signal is shown during an arc event. A Langmuir probe was used to confirm the same arc event as captured by RF signal probe 52, which produced the plot shown in FIG. 4B. The plots of FIGS. 4A and 4B show voltage shifts that last 25.5 microseconds and 27.5 microseconds, respectively, during the arc event. Experimental results at other delivered RF power levels (not shown) indicate that the duration of the voltage shift varies between about 10 and 30 microseconds based on the delivered RF power level and stochastic elements unique to the signature of the arc. The plot of FIG. 4B therefore shows that signal from RF signal probe 52 can be processed using the method shown in FIG. 3 to indicate an arc has occurred. More specifically, block 72 of the method can monitor the signal from RF signal probe 52 for indications that the RF voltage has decreased for no apparent reason, such as a decrease in the desired RF voltage from RF power supply 58.

Figure 5A:
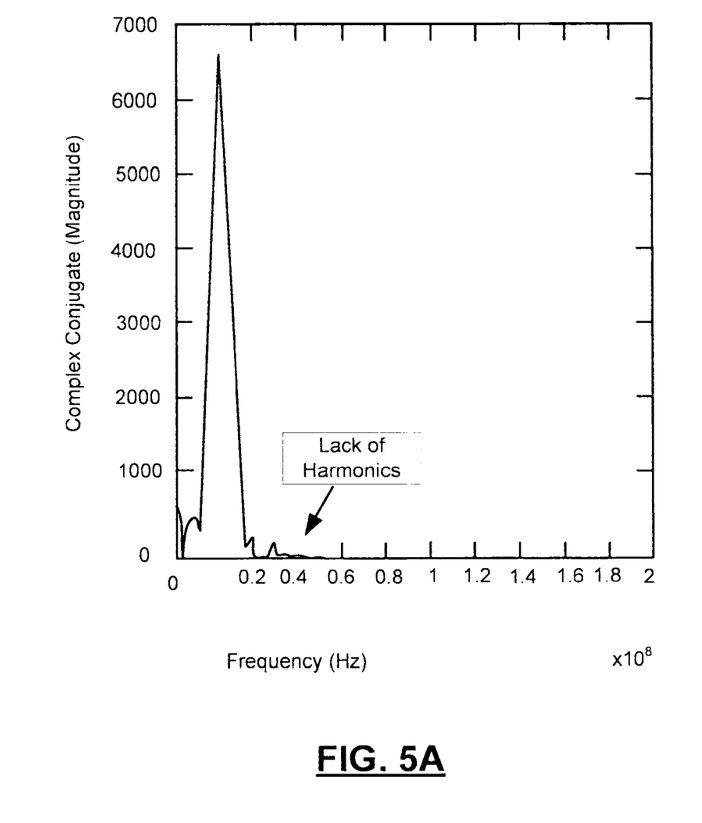
FIGS. 5A and 5B are plots of RF harmonics in normal plasma and arcing plasma, respectively.
Figure 5B:
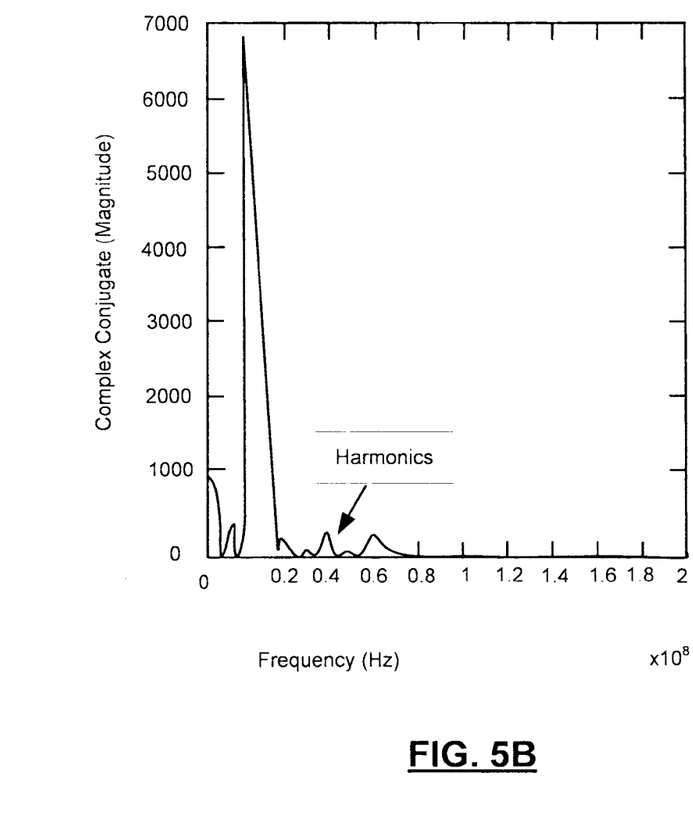

Referring now to FIGS. 5A and 5B, FFT plots are shown of the waveform that is shown in FIG. 4B. The FFT plots were generated with Matlab software available from The MathWorks, Inc., although it should be appreciated by those skilled in the art that other methods of generating FFTs may be used. The FFT plot of FIG. 5A represents frequency components of the waveform of FIG. 4B prior to the arc event. The FFT plot of FIG. 5B represents frequency components of the waveform of FIG. 4B during the arc event.

The FFT's were generated with a sliding window size between 3-5 RF cycles. A peak detect function was used to capture the maximum amplitude of the signal as well as the amplitude of the harmonics. The FFT waveforms reveal harmonics that coincide with the initial shift in the voltage signal amplitude. As seen in FIG. 5B, the magnitudes of the third harmonic of 13.56 MHz is evident at the time of an arc, though not before the arc as evidenced by FIG. 5A. FIGS. 5A and 5B therefore show that the method of FIG. 3 can employ FFTs to determine the magnitudes of frequency components at or above the fundamental frequency to detect an arc in plasma chamber 56.

Figure 6:
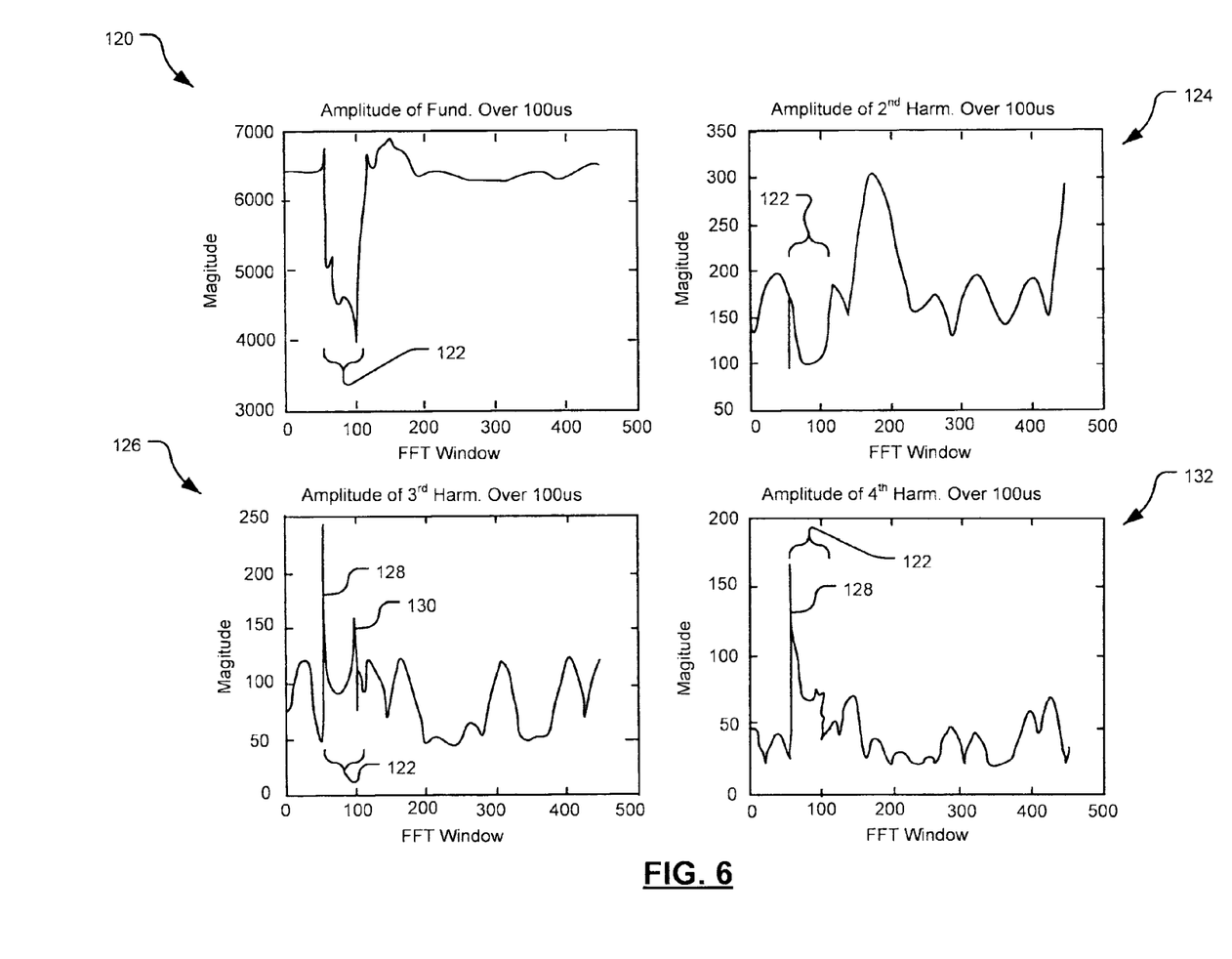
FIG. 6 is a set of plots of RF harmonics during a plasma arc.

Referring now to FIG. 6, peak magnitudes are shown of the fundamental, second harmonic, third harmonic, and fourth harmonic frequencies as a function of the FFT window interval. The plasma arc occurs from about the fiftieth FFT window to about the hundredth FFT window. A first plot 120 shows that the peak amplitude of the fundamental frequency drops during a period 122 that corresponds with the arc. A second plot 124 shows that the peak amplitude of the second harmonic frequency also drops during the arc. A third plot 126 shows that the peak amplitude of the third harmonic frequency spikes dramatically at the beginning 128 and the end 130 of the arc. A fourth plot 132 shows that the peak amplitude of the fourth harmonic frequency spikes dramatically at the beginning 128 of the arc. RF analyzer 54 can detect the arc by detecting one or more of the spikes and/or drops that are shown in plots 120, 124,126 and/or 132.

Figure 7:
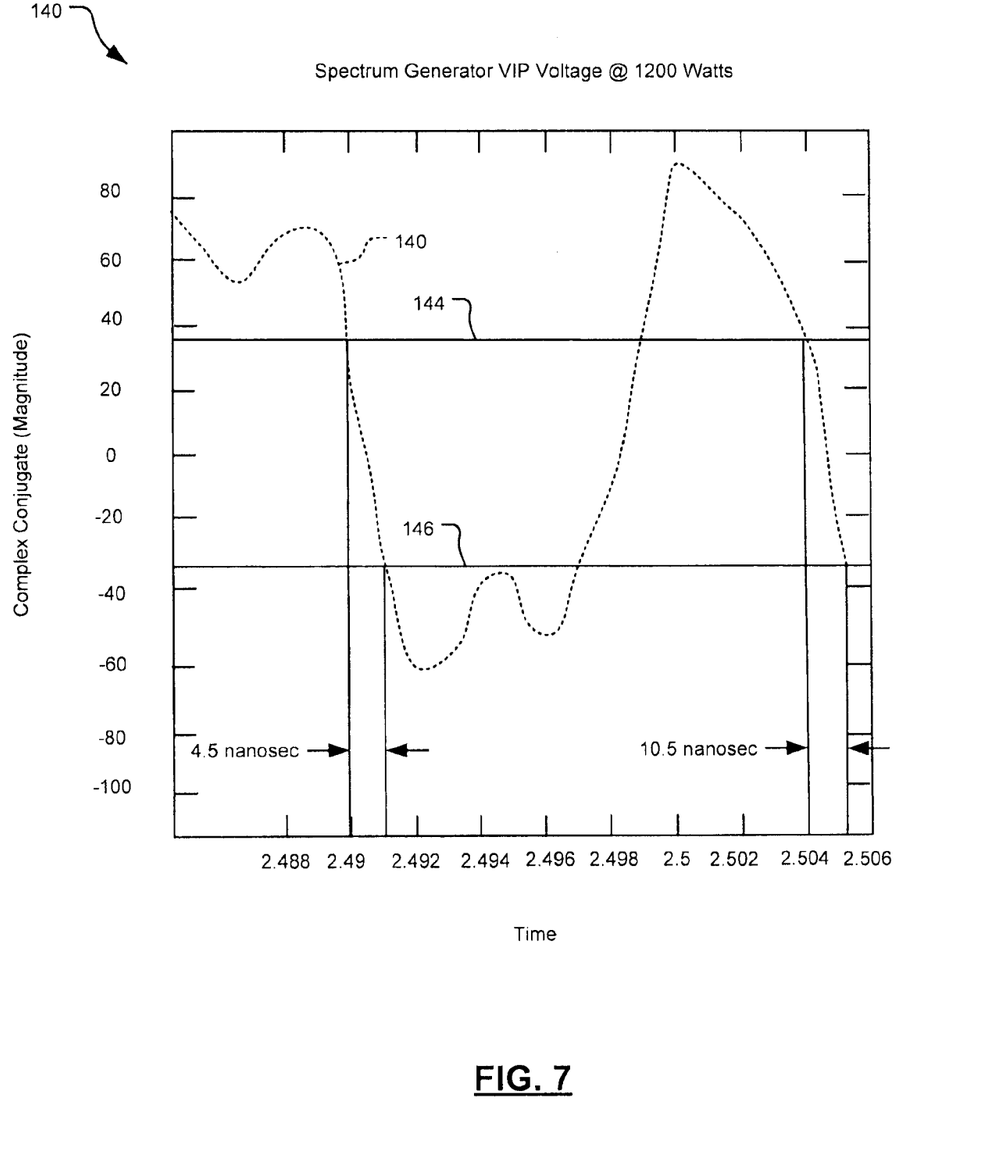
FIG. 7 is a plot of phase shift of the RF voltage during a plasma arc.

Referring now to FIG. 7, a plot 140 shows an output signal 142 of a phase detector. The phase detector can be included in RF analyzer 54 and detects the phase of the RF voltage. A vertical axis of plot 140 represents a phase of the fundamental frequency. A predetermined first phase threshold 146 and a predetermined second phase threshold 144 are also shown on the vertical axis. A horizontal axis of plot 140 represents time.

The phase detector indicates that the arc is beginning when the output signal 142 is falling and crosses the first threshold 144. The phase detector indicates that the arc has ended when the output signal 142 is falling and crosses the second threshold 146. The values of the predetermined first and second thresholds 144, 146 can be experimentally determined by correlating the output signal 142 with the beginning and end of arcs.

Figure 8:
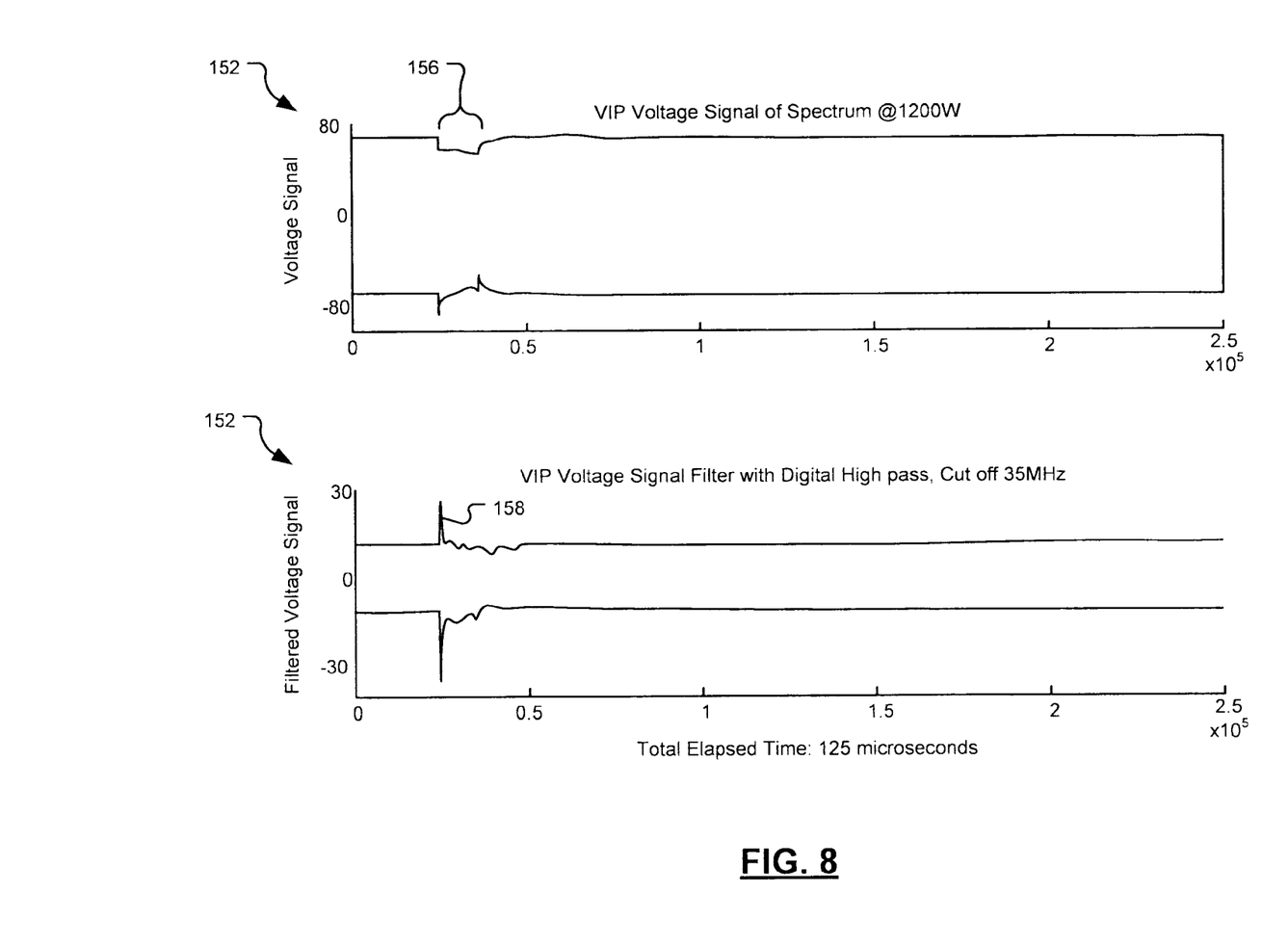
FIG. 8 is a set of plots of the RF voltage signal envelope before and after digital filtering.

Referring now to FIG. 8, a first plot 150 is shown of the RF voltage signal envelope prior to high-pass filtering. First plot 150 is time-correlated to a second plot 152 that shows the RF voltage signal envelope after high-pass filtering. The vertical axes of both plots 150 and 152 represent volts. The horizontal axes of both plots 150 and 152 represent time.

The high-pass filter isolates the harmonics in the RF signal that have the greatest rate of change during an arc. In some embodiments the high-pass filters can be $6^{th}$ order Infinite Impulse Response (IIR) filter. In some embodiments a cutoff frequency of the high-pass filter is greater than the second harmonic frequency and less than the third harmonic frequency. The high-pass filter can be implemented in RF analyzer 54.

First plot 150 shows the RF signal voltage envelope while an arc occurs during a period 156. Second plot 152 shows spike 158 that coincides with the beginning of the arc. RF analyzer 54 can therefore detect an arc by monitoring the filtered RF voltage for spikes 158 that exceed a threshold amplitude.

The threshold amplitude for spikes 158 can be predetermined based upon the signal to noise ratio of the filtered RF voltage signal, the ratio of the unfiltered voltage to filtered voltage, and the like. Both the signal to noise ratio and the ratio of filtered to unfiltered signals can be employed to account for noise floor impedance shifts within the plasma and thus reduce the possibilities of false arc triggers.

Figure 9:
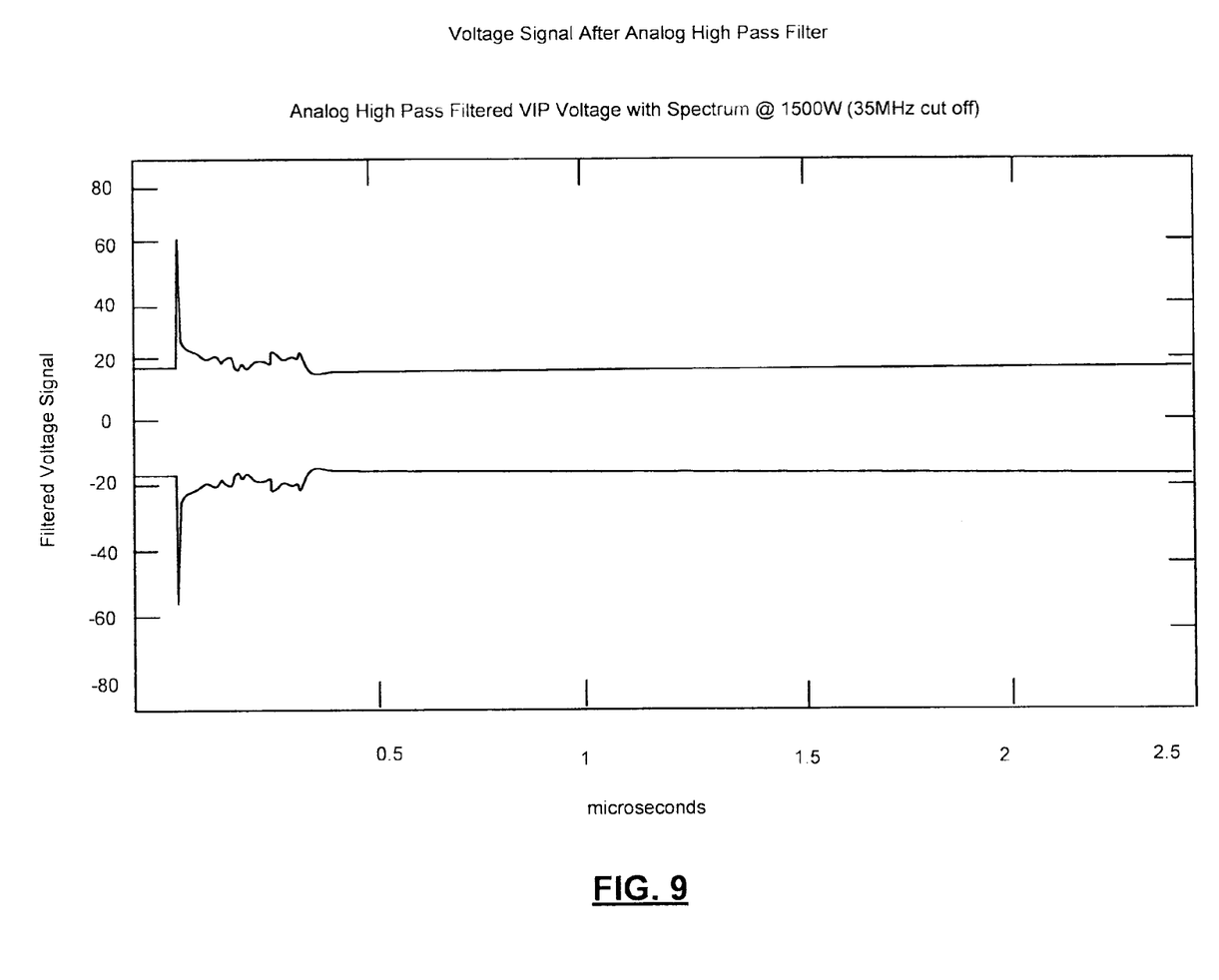
FIG. 9 is a plot of the RF voltage signal envelope after an analog high-pass filter.

The RF signal voltage can also be filtered with an analog high-pass filter prior to detecting spikes 158. FIG. 9 shows the filtered RF signal voltage envelope after an analog high-pass modified Chebyshev filter. RF analyzer 54 can detect spikes 158 in the digitized signal and indicate that there is an arc in plasma chamber 56.

What is claimed is:

1. An arc detection system, comprising:
a radio frequency (RF) signal probe that senses a RF signal at an input of a RF plasma chamber and that generates a signal based on at least one of the voltage, current, and power of the RF signal; and
a signal analyzer that receives the signal, monitors the signal for frequency components at at least one harmonic frequency of a fundamental frequency of the RF signal, and that generates an output signal based on the frequency components wherein the output signal indicates that an arc is occurring in the RF plasma chamber.

2. The arc detection system of claim 1 wherein the frequency components include at least one or more of a second harmonic through ninth harmonic of the fundamental frequency.

3. The arc detection system of claim 1 wherein the signal analyzer generates the output signal based on a phase of the signal.

4. The arc detection system of claim 1 wherein the signal analyzer compares an amplitude of the signal to a first predetermined amplitude.

5. The arc detection system of claim 4 wherein the signal analyzer compares a rate of change of the signal to a predetermined rate of change.

6. The arc detection system of claim 5 wherein the signal analyzer generates the output signal when the rate of change of the signal exceeds the predetermined rate of change and the amplitude of the signal is between the first predetermined amplitude and a second predetermined amplitude.

7. The arc detection system of claim 1 further comprising a high-pass filter that filters the signal that is communicated to the signal analyzer.

8. The arc detection system of claim 7 wherein the high-pass filter is a modified Chebyshev filter.

9. The arc detection system of claim 1 wherein the signal analyzer generates the output signal further based on a signal-to-noise ratio of the signal.

10. An arc detection system, comprising:
a radio frequency (RF) signal probe that senses a RF signal at an input of a RF plasma chamber and that generates a signal based on at least one of the voltage, current, and power of the RF signal;
an analog to digital converter that converts the signal to a digital signal; and
a signal analyzer that receives the digital signal, monitors the digital signal for frequency components of the RF signal at at least one harmonic frequency, ignoring frequencies intermediate to fundamental and harmonic frequencies of the RF signal, and that generates an output signal based on the frequency components wherein the output signal indicates that an arc is occurring in the RF plasma chamber.

11. The arc detection system of claim 10 wherein the frequency components include at least one of the first nine harmonics of the fundamental frequency.

12. The arc detection system of claim 10 wherein the signal analyzer generates the output signal based on a phase of the RF signal as indicated by the digital signal.

13. The arc detection system of claim 10 wherein the signal analyzer compares an amplitude of the RF signal, as indicated by the digital signal, to a predetermined threshold.

14. The arc detection system of claim 13 wherein the signal analyzer compares a rate of change of the RF signal, as indicated by the digital signal, to a predetermined rate of change.

15. The arc detection system of claim 14 wherein the signal analyzer generates the output signal when the rate of change of the RF signal exceeds the predetermined rate of change and the RF signal amplitude is between the first predetermined threshold and a second predetermined threshold.

16. The arc detection system of claim 10 wherein the signal analyzer performs a fast-Fourier transform on the digital signal.

17. The arc detection system of claim 16 wherein the FFT generates a plurality of signals that represent corresponding harmonic frequencies of the RF signal.

18. The arc detection system of claim 17 wherein the signal analyzer generates the output signal when amplitudes of the signals exceed corresponding predetermined amplitudes.

19. The arc detection system of claim 16 wherein the FFT is a sliding-window FFT.

20. The arc detection system of claim 19 wherein the sliding-window FFT includes a window size between 3 and 5 cycles of the RF signal, inclusive.

21. The arc detection system of claim 10 further comprising a digital high-pass filter that filters the digital signal that is received by the signal analyzer.

22. The arc detection system of claim 21 wherein the digital filter is an infinite impulse response (IIR) filter.

23. The arc detection system of claim 22 wherein the IIR filter is sixth-order.

24. A method of detecting an arc in a RF plasma processing system, comprising:
    sensing a RF signal at an input of a RF plasma chamber;
    generating a signal based on at least one of the voltage, current, and power of the RF signal;
    monitoring the signal for frequency components substantially at a harmonic frequency of a selected fundamental frequency within the RF signal; and
    generating an output signal based on the frequency components wherein the output signal indicates that an arc is occurring in the RF plasma chamber.

25. The method of claim 24 wherein the frequency components include at least one of a first harmonic through ninth harmonic of the fundamental frequency.

26. The method of claim 24 further comprising generating the output signal based on a phase of the signal.

27. The method of claim 24 further comprising comparing an amplitude of the signal to a first predetermined threshold.

28. The method of claim 27 further comprising comparing a rate of change of the signal to a predetermined rate of change.

29. The method of claim 28 wherein generating the output signal occurs when the rate of change of the signal exceeds the predetermined rate of change and the amplitude of the signal is between the first predetermined threshold and a second predetermined amplitude.

30. The method of claim 24 further comprising high-pass filtering the signal that is communicated to the signal analyzer.

31. The method of claim 24 further comprising generating the output signal based on a signal-to-noise ratio of the signal.

32. A method of detecting an arc in a RF plasma processing system, comprising:
    sensing a RF signal at an input of a RF plasma chamber;
    generating a signal based on at least one of the voltage, current, and power of the RF signal;
    converting the signal to a digital signal;
    monitoring the digital signal for frequency components of the RF signal at a harmonic frequency of a fundamental frequency of the RF signal; and
    generating an output signal based on the frequency components wherein the output signal indicates that an arc is occurring in the RF plasma chamber.

33. The method of claim 32 wherein the frequency components include at least one of a harmonic of the fundamental frequency.

34. The method of claim 32 further comprising generating the output signal based on a phase of the RF signal as indicated by the digital signal.

35. The method of claim 32 further comprising comparing an amplitude of the RF signal, as indicated by the digital signal, to a predetermined threshold.

36. The method of claim 35 further comprising comparing a rate of change of the RF signal, as indicated by the digital signal, to a predetermined rate of change.

37. The method of claim 36 further comprising generating the output signal when the rate of change of the RF signal exceeds the predetermined rate of change and the RF signal amplitude is between the first predetermined threshold and a second predetermined threshold.

38. The method of claim 32 further comprising performing a fast-Fourier transform on the digital signal.

39. The method of claim 38 wherein the FFT generates a plurality of signals that represent corresponding harmonic frequencies of the RF signal.

40. The method of claim 39 further comprising generating the output signal when amplitudes of the signals exceed corresponding predetermined amplitudes.

41. The method of claim 38 wherein the FFT is a sliding-window FFT.

42. The method of claim 41 wherein the sliding-window FFT includes a window size between 3 and 5 cycles of the RF signal, inclusive.

43. The method of claim 32 further comprising digitally filtering the digital signal that is received by the signal analyzer.

44. The method of claim 43 wherein the digital filtering is infinite impulse response (IIR) filtering.

45. The method of claim 44 wherein the IIR filtering is sixth-order.

* * * * *